(12) United States Patent
Yamashita et al.

(10) Patent No.: US 8,717,452 B2
(45) Date of Patent: May 6, 2014

(54) SOLID STATE IMAGE PICKUP APPARATUS

(75) Inventors: Yuichiro Yamashita, Ebina (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 462 days.

(21) Appl. No.: 12/575,255

(22) Filed: Oct. 7, 2009

(65) Prior Publication Data

US 2010/0091157 A1   Apr. 15, 2010

(30) Foreign Application Priority Data

Oct. 9, 2008   (JP) ................. 2008-262997

(51) Int. Cl.
*H04N 5/228*   (2006.01)
*H04N 5/217*   (2011.01)

(52) U.S. Cl.
USPC ....................... 348/222.1; 348/241

(58) Field of Classification Search
USPC .................. 348/241, 294, 301, 302, 308; 250/208.1, 370.99
See application file for complete search history.

(56) References Cited

U.S. PATENT DOCUMENTS

| | | | |
|---|---|---|---|
| 6,087,686 A | | 7/2000 | Fox et al. |
| 7,399,951 B2 * | | 7/2008 | Morimoto et al. ......... 250/208.1 |
| 7,420,603 B2 * | | 9/2008 | Mishina et al. ............... 348/294 |
| 7,719,590 B2 * | | 5/2010 | Ellis-Monaghan et al. .. 348/308 |
| 2004/0051801 A1 | | 3/2004 | Iizuka et al. |
| 2006/0219868 A1 | | 10/2006 | Morimoto et al. |
| 2006/0261246 A1 * | | 11/2006 | Krymski .................... 250/208.1 |
| 2009/0073289 A1 * | | 3/2009 | Xu et al. ....................... 348/243 |

FOREIGN PATENT DOCUMENTS

| | | |
|---|---|---|
| EP | 1681850 A1 | 7/2006 |
| JP | 2000-165754 A | 6/2000 |
| JP | 2006-196742 A | 7/2006 |
| JP | 2006-217410 A | 8/2006 |
| JP | 2006-246450 A | 9/2006 |
| JP | 2008-099158 A | 4/2008 |
| JP | 2008-141235 A | 6/2008 |

\* cited by examiner

*Primary Examiner* — Trung Diep
(74) *Attorney, Agent, or Firm* — Canon USA, Inc. IP Division

(57) ABSTRACT

An apparatus includes a plurality of pixels each including a charge storage part, a photoelectric conversion part, a first transfer part and a second transfer part, when a signal charge generated during one period is transferred to an amplifier, a control unit supplies pulses such that a turning-on pulse is supplied to the second transfer part while supplying a turning-off pulse to the first transfer part thereby transferring the stored signal charge to the amplifier, a turning-on pulse is then supplied to a reset part to reset the signal charge transferred to the amplifier, and subsequently a turning-on pulse is supplied to the first transfer part and the second transfer part to transfer the signal charge held in the photoelectric conversion part to the amplifier.

20 Claims, 16 Drawing Sheets

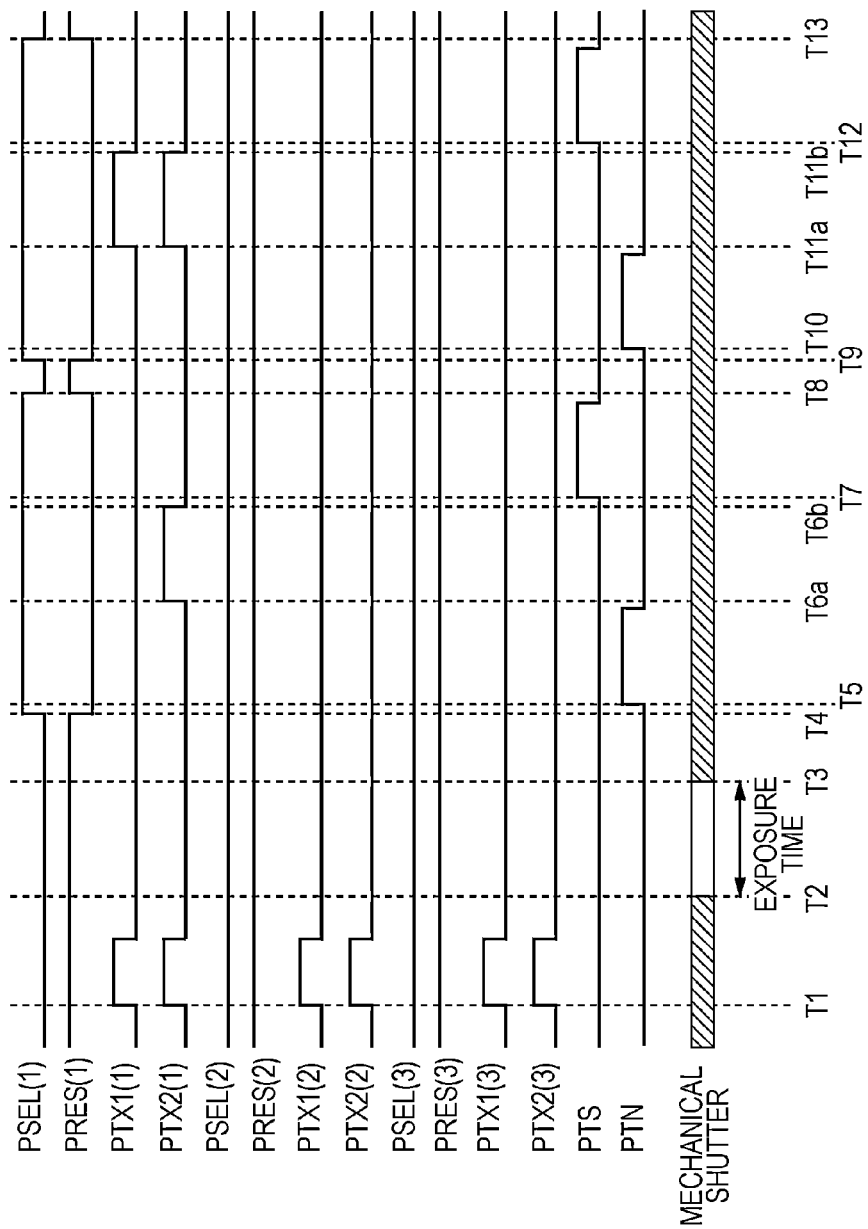

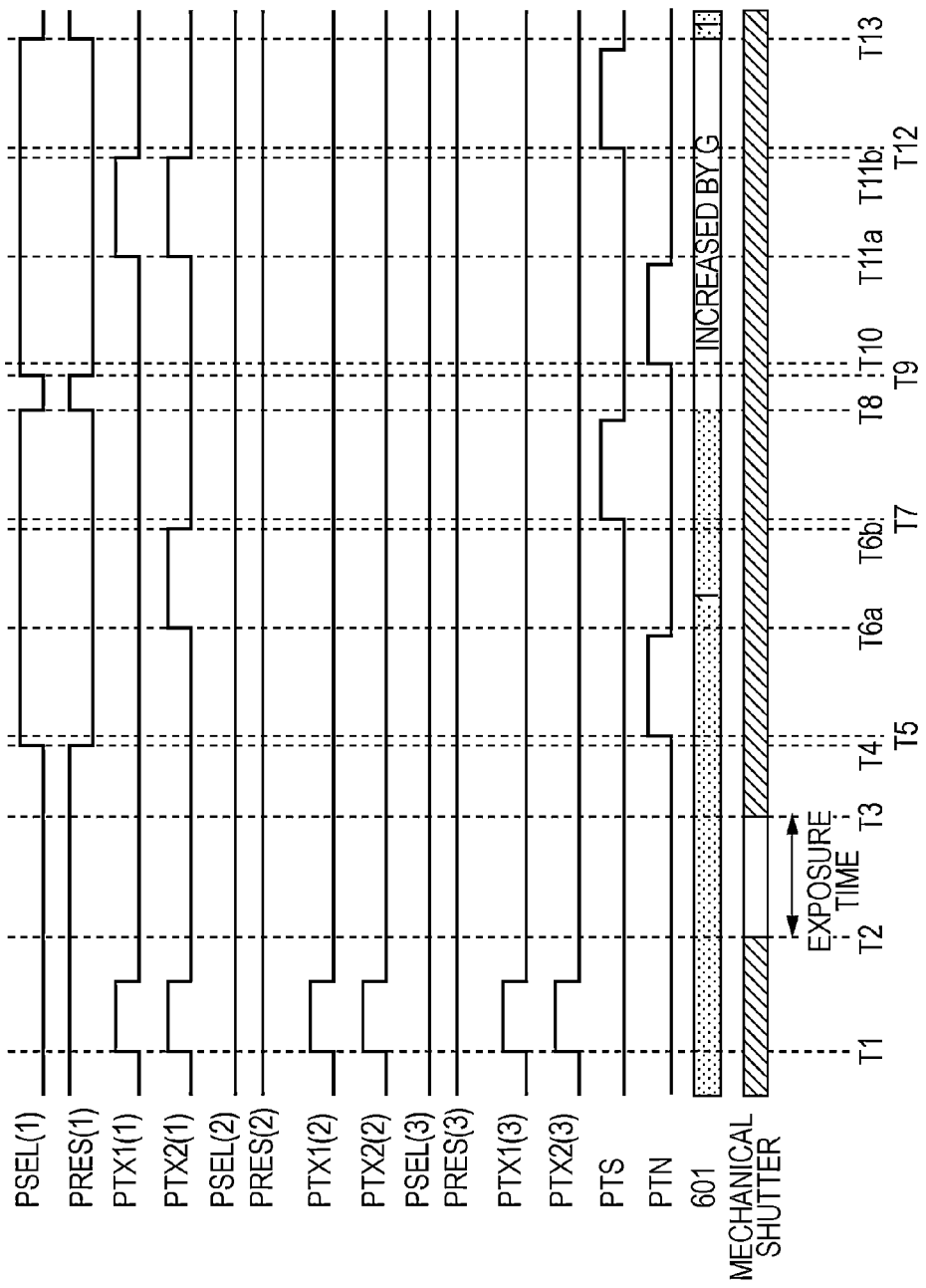

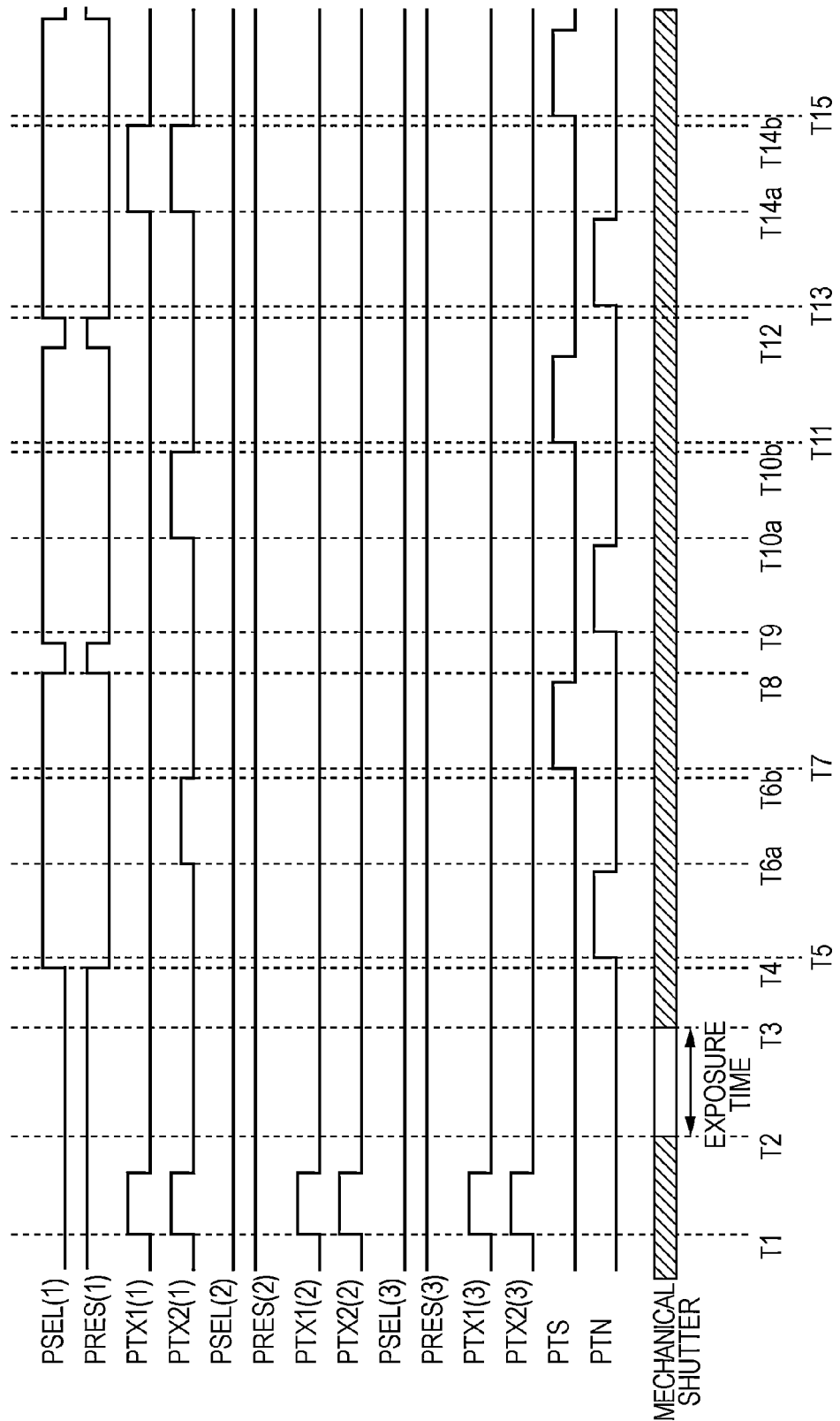

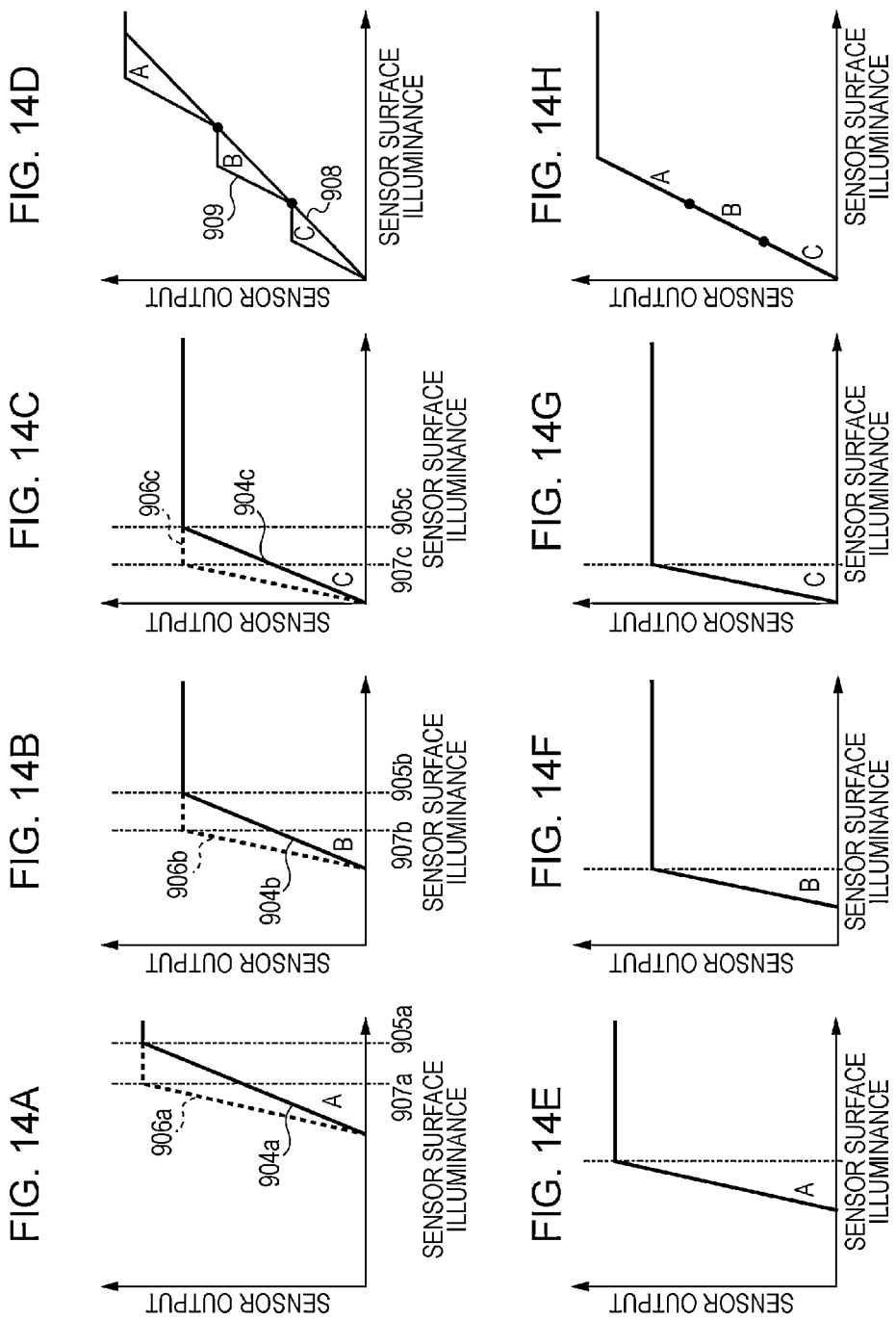

SOLID STATE IMAGE PICKUP APPARATUS

BACKGROUND OF THE INVENTION

1. Field of the Invention

The present invention relates to a solid state image pickup apparatus, and more particularly, to a technique to expand the dynamic range thereof.

2. Description of the Related Art

In an amplification-type image pickup apparatus such as that known as a CMOS image sensor, there are various known electronic shutter techniques to control starting and ending of accumulation for all pixels over an entire plane without using a method of mechanically blocking light.

In a technique associated with an electronic shutter disclosed in Japanese Patent Laid-Open No. 2006-246450, a charge generated in a photoelectric conversion part in a signal charge generation period is transferred to a charge storage part, and, after the end of exposure, the photoelectric conversion part is reset to remove the charge remaining in the photoelectric conversion part thereby achieving a function of the electronic shutter.

This technique is characterized in that functions are implemented separately by dedicated parts such that the photoelectric conversion part basically performs only photoelectric conversion and charge accumulation during an exposure period is performed by the charge storage part disposed adjacent to the photoelectric conversion part. Note that the charge storage part is disposed separately from the FD region. Because the saturation number of charges in the photoelectric conversion part is small, transferring of the charge from the photoelectric conversion part to the charge storage part can be performed using a low voltage. This device can be easily produced by a simple process based on a general CMOS production process, i.e., the production thereof is easier than CCD or other similar devices. Note that herein and elsewhere in the present description, it is assumed that charges are provided by electrons. Thus the expression "the number of charges" should be read as "the number of electrons" in the case where electrons are used.

In the technique disclosed in Japanese Patent Laid-Open No. 2006-246450, the provision of the charge storage part in each pixel leads to an increase in the saturation amount of charge. However, the increase in the saturation amount of charge can cause a signal to be limited in terms of a range by the dynamic range of a reading circuit disposed at a stage following the photoelectric conversion part and the charge storage part. This situation arises from the above-described configuration in which the function of photoelectric conversion and the function of accumulating the signal charges are separately implemented, and each of these two functions is individually optimized.

In view of the above, the present invention provides a technique to produce an image signal by fully using the signal charges, whose amount is increased by the charge storage part disposed separately, without being limited by the dynamic range of the reading circuit disposed at the following stage.

SUMMARY OF THE INVENTION

An apparatus comprise a plurality of pixels, each pixel includes a photoelectric conversion part, a charge storage part configured to store a signal charge transferred by a first transfer part from the photoelectric conversion part, an amplifier configured to amplify a signal based on the signal charge transferred by a second transfer part, and a reset part, and a control unit configured to supply driving pulses, wherein when a signal charge generated during one period is transferred to the amplifier, the control unit supplies pulses such that a turning-on pulse is supplied to the second transfer part while supplying a turning-off pulse to the first transfer part thereby transferring the stored signal charge to the amplifier, a turning-on pulse is then supplied to the reset part to reset the signal charge transferred to the amplifier, and subsequently a turning-on pulse is supplied to the first transfer part and the second transfer part to transfer the signal charge stored in the photoelectric conversion part to the amplifier.

Further features of the present invention will become apparent from the following description of exemplary embodiments with reference to the attached drawings.

BRIEF DESCRIPTION OF THE DRAWINGS

FIG. 3 is a diagram illustrating driving pulses according to an embodiment of the invention.

FIG. 6 is a diagram illustrating driving pulses according to an embodiment of the invention.

FIG. 10 is a diagram illustrating driving pulses according to an embodiment of the invention.

FIGS. 14A to 14H are graphs each showing a relationship between illuminance and output.

DESCRIPTION OF THE EMBODIMENTS

Embodiments of the present invention are described in detail below with reference to the accompanying drawings.

First, a configuration of a solid state image pickup apparatus and an equivalent circuit of a pixel, which are common to all embodiments described below, are explained with reference to FIGS. 1 and 2.

Figure 1:
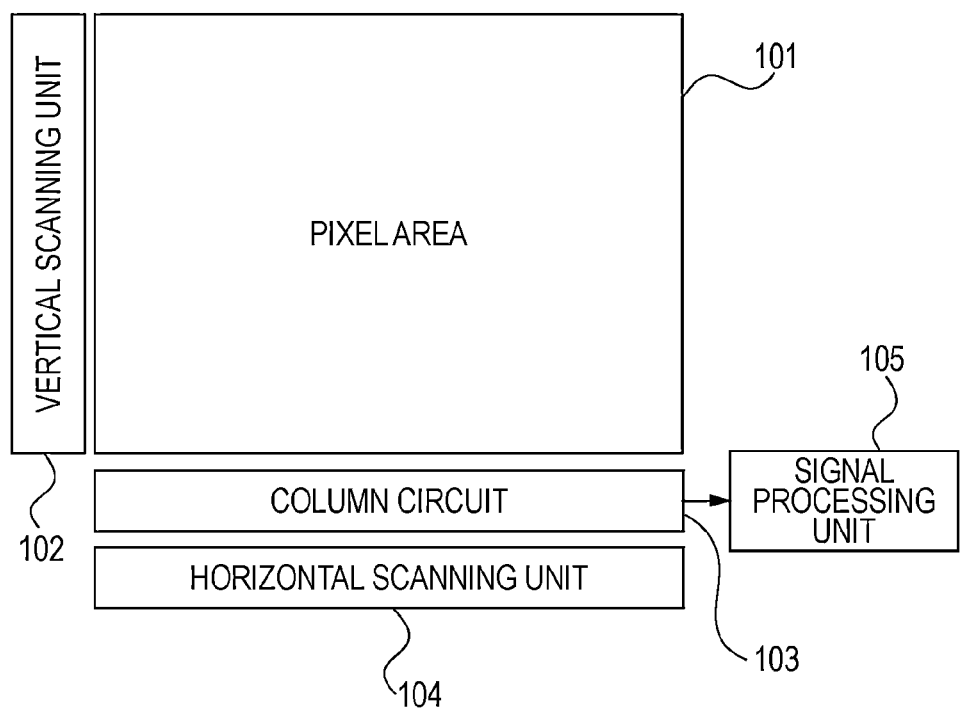
FIG. 1 is a block diagram illustrating a solid state image pickup apparatus according to an embodiment of the present invention.

In FIG. 1, reference numeral 101 denotes a pixel area in which a plurality of pixels are arranged in the form of a matrix. Reference numeral 102 denotes a vertical scanning unit configured to scan pixels in the pixel area in units of one or more pixel rows. The vertical scanning unit 102 may be constructed using a shift register or a decoder.

Reference numeral 103 denotes a column circuit configured to process a signal scanned and read from the pixel area 101 by the vertical scanning unit. The column circuit may include, for example, a CDS circuit configured to reduce pixel noise, an amplifier configured to amplify a signal output from each pixel, an analog-to-digital converter configured to convert an analog signal received from each pixel into digital form, etc.

Reference numeral 104 denotes a horizontal scanning unit configured to sequentially scan pixels in the pixel area in units of one or more columns to read the signal processed by the column circuit. The horizontal scanning unit may be constructed, as with the vertical scanning unit, using a shift register or a decoder.

Reference numeral 105 denotes a signal processing unit configured to perform particular processing on a signal output from the solid state image pickup apparatus.

There are interconnections by which to transmit an optical signal, a driving signal, and other signals between the constituent parts described above, although the interconnections are not shown in FIG. 1.

Figure 2:
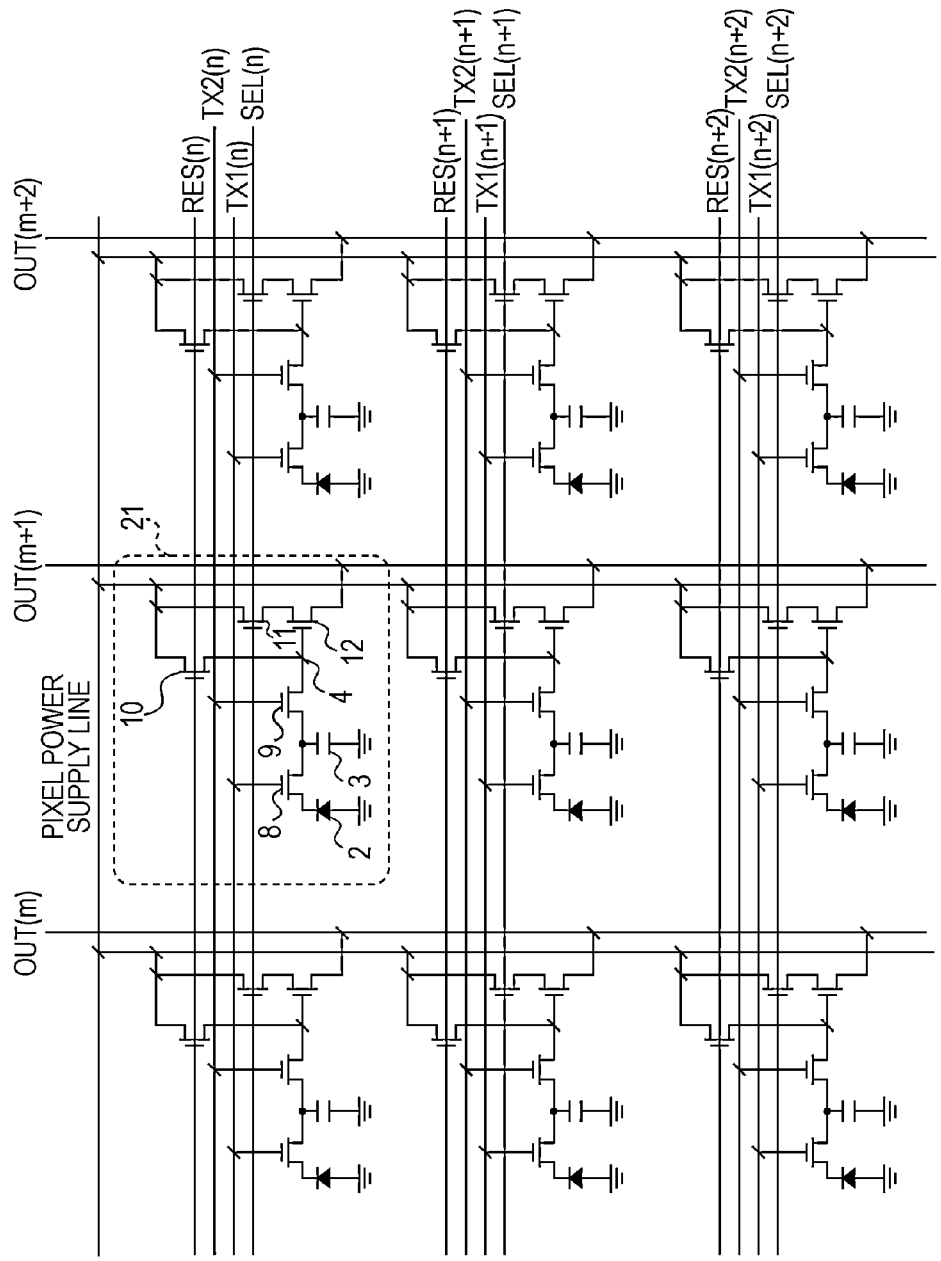
FIG. 2 is an equivalent circuit of pixels disposed in a pixel area of a solid state image pickup apparatus according to an embodiment of the present invention.

FIG. 2 illustrates an equivalent circuit of pixels arranged in the pixel area. Although FIG. 2 shows, for simplicity, only 9 pixels arranged in the form of a 3×3 array included in the pixel area 101, the number of pixels is not limited to this example. Reference numeral 2 denotes a photodiode (PD) functioning as a photoelectric conversion part. An anode of the photodiode is connected to a fixed voltage level (for example, a ground level). A cathode of the photodiode is connected to one end of a charge storage part 3 via a first transfer transistor 8 functioning as a first transfer part. The other end of the charge storage part 3 is connected to a fixed voltage level (for example, the ground level). The foregoing one end of the charge storage part 3 is also connected to an FD region 4 via a second transfer transistor 9 functioning as a second transfer part. The FD region 4 is also connected to a gate electrode of an amplifying transistor 12 functioning as a part of an amplifier. The gate of the amplifying transistor 12 functions as an input part of the amplifier. The gate of the amplifying transistor 12 is also connected to a pixel power supply line via a reset transistor 10 functioning as a reset part. A MOS transistor may be used as each transfer transistor.

A selection transistor 11 functioning as a selection part is connected such that a drain electrode functioning as one main electrode is connected to the pixel power supply line, and a source electrode functioning as the other main electrode is connected to a drain, functioning as one main electrode, of the amplifying transistor 12. If an active signal SEL is input, the selection transistor turns on and thus the two main electrodes of the selection transistor are electrically connected to each other. As a result, the amplifying transistor 12 forms a source follower circuit in conjunction with a constant current source (not shown) connected to a vertical signal line OUT, and a signal corresponding to a voltage of the gate electrode serving as a control electrode of the amplifying transistor 12 appears on the vertical signal line OUT. According to the signal appearing on the vertical signal line OUT, a signal is output from the solid state image pickup apparatus. The signal is passed through a signal processing circuit and other circuit elements whereby an image signal is formed.

In the example shown in FIG. 2, each pixel includes a reset part, an amplifier, and a selection part. Alternatively, a plurality of pixels may share a reset part, an amplifier, and a selection part. Without providing the selection part, each pixel may be selected by controlling the voltage of the input part of the amplifier.

An example of a configuration of a solid state image pickup apparatus, applicable in common to embodiments of the invention, has been described above in which a charge storage part is disposed between a photoelectric conversion part and an FD region.

In a specific embodiment, the solid state image pickup apparatus may be configured such that a mechanism is provided in a charge path between the photoelectric conversion part and the charge storage part to allow charges to be transferred from the photoelectric conversion part to the charge storage part in a state in which a low-level pulse is supplied to the first transfer part to maintain the first transfer part in the off-state.

More specifically, for example, when the first transfer part is realized using a MOS transistor, the above-described mechanism is achieved by constructing the MOS transistor in the form of a buried-channel structure such that when the MOS transistor is in the off-state, there is a partially lowered part in a potential barrier formed at a depth below the surface. In this case, during a period in which the signal charges are accumulated, the charge transfer part may not perform a purposive control operation, and the charge transfer part may be maintained at a fixed voltage. That is, instead of providing the function of the transfer part, a fixed potential barrier may be formed. Immediately before the end of accumulation, the height of the potential barrier may be lowered so that the signal charges remaining in the photoelectric conversion part are transferred to the charge storage part.

In this configuration, when light is incident on the photoelectric conversion part, signal charges corresponding to the incident light are generated via the photoelectric conversion, and almost all generated signal charges are transferred to the charge storage part without being stored in the photoelectric conversion part. Therefore, it is possible to achieve the same charge accumulation period for all photoelectric conversion parts of the respective pixels. When a MOS transistor is in an off-state, holes are accumulated in a channel surface of the MOS transistor, wherein the channel through which the charge is transferred is at a particular depth below the surface. This allows a reduction in influence of dark current at an interface of an insulating film.

In other words, during a period in which the signal charges are accumulated in the photoelectric conversion part and the charge storage part, the potential barrier between the photoelectric conversion part and the charge storage part in a charge path is lower than the potential barrier between the photoelectric conversion part and other regions in the charge path. Note that the potential is herein defined with respect to the signal charge. For example, when an OFD region is provided, the potential barrier between the photoelectric conversion part and the charge storage part is set to be lower than the potential barrier between the photoelectric conversion part and the OFD region.

In a specific implementation, the charge storage part may be configured using a charge couple device so that during a period in which the signal charges are accumulated in the charge storage part, a voltage is applied to an opposing electrode disposed via an insulating film so as to accumulate charges with a polarity opposite to that of the signal charges at the surface of the charge storage part. This can lead to a reduction in generation of a dark charge at a semiconductor surface in a region where the charge storage part is disposed.

Thus, the configuration described above allows a further reduction in a dark current associated with the charge storage part. Furthermore, in the configuration described above, it is not necessary, in order to reduce the dark current, to implant an impurity with an opposite conduction type in the surface of the charge storage part, and thus it is allowed to form the part responsible for holding the charge at a shallower depth below the surface compared with the configuration using the photodiode. This allows an increase in the capacity of storing the charge per unit area. For example, the capacity of storing the charge can be a few times that of the conventional configuration in which the photodiode also functions as the charge storage part.

The driving operation is performed such that the signal charges transferred from the photoelectric conversion part to the charge storage part during one signal charge generation period are stored in the charge storage part and used as an image signal. In other words, after one signal charge generation period is started in the photoelectric conversion part, the signal is read to the outside of the pixel without resetting the charge storage part. Note that one signal charge generation period is determined in a period in forming one frame of image such that the period is common to all photoelectric conversion parts of the pixels.

Specific embodiments in terms of the configuration and the driving method according to the present invention are described below. In these specific embodiments described below, it is assumed that each pixel is configured such that the first transfer part is constructed using a buried-channel MOS transistor, and the charge storage part is realized by a charge coupled device. The first and second transfer parts are realized using transistors.

FIG. 3 is a diagram illustrating driving pulses according to a first embodiment of the invention, and FIGS. 4A to 4H illustrate potential profiles in various states. In the present embodiment, signal charges generated during a one signal charge generation period are transferred to the amplifier as follows. First, a turning-on pulse is supplied only to the second transfer part to transfer the signal charges stored in the charge storage part to the amplifier. Thereafter, a turning-on pulse is supplied to the reset part to reset the signal charges transferred to the amplifier. Subsequently, a turning-on pulse is supplied to the first and second transfer parts to transfer the signal charges stored in the photoelectric conversion part to the amplifier. Note that the driving pulses are supplied to respective elements from the vertical scanning unit 102 so that the operation described above is properly performed. Thus, the vertical scanning unit 102 or a combination of the vertical scanning unit 102 and a timing generator that controls the vertical scanning unit 102 can be referred to as a control unit that supplies the driving pulses.

In FIG. 3, PTX1 denotes a driving pulse supplied to the first transfer transistor, PTX2 denotes a driving pulse supplied to the second transfer transistor, PRES denotes a driving pulse supplied to the reset transistor, and PSEL denotes a driving pulse supplied to the selection transistor. Each numeral in parentheses indicates a pixel row number. In the present embodiment, the image pickup apparatus has a mechanical shutter that operates such that when the mechanical shutter is in an open state, light is incident on the photoelectric conversion part, while when the mechanical shutter is in a closed state, no light is incident on the photoelectric conversion part. That is, the mechanical shutter controls the exposure condition of the photoelectric conversion part whereby the signal charge generation period is determined. In FIG. 3, solid bands indicate periods in which the mechanical shutter is in the closed state, while an open band indicates a period in which the mechanical shutter is in the open state.

PTS denotes a sampling pulse to capture a signal into a photo signal storage part in the column circuit. PTN denotes a sampling pulse to capture a signal into a noise signal storage part in the column circuit. The noise signal includes random noise and offset of a reset transistor of a pixel and an amplifying transistor. In a case where the column circuit includes an amplifier, the noise signal includes an offset of the column amplifier.

Note that a high-level pulse is used as a turning-on pulse to turn on each transistor or as a sampling pulse.

In the present embodiment, after the signal charges stored in the charge storage part are transferred to the amplifier, the signal charges transferred to the amplifier are reset. Thereafter, the charges stored in the photoelectric conversion part are transferred to the FD region via the charge storage part.

First, at T1, a high-level pulse is supplied to the reset transistor and first and second transfer transistors thereby turning on them and thus resetting the charge in the photoelectric conversion part, the charge storage part, and the FD region. In this process, the mechanical shutter is maintained in the closed state.

At T2, the mechanical shutter is opened so that light is incident on the photoelectric conversion part. In this state, a low-level pulse is supplied to the respective transfer transistors so that the transfer transistors are turned off.

At T3, the mechanical shutter is closed.

At T4, a low-level pulse is supplied as PRES to pixels in the first row, and a high-level pulse is supplied as PSEL. Although in the present example, the low-level pulse PRES and the high-level pulse PSEL are supplied at the same time, they may be supplied at different times. Note that to suppress kTC noise in the reset part, the low-level pulse should be supplied as PRES at least over a period during which the high level is supplied as PTN to sample a noise signal.

At T5, a high-level pulse is supplied as PTN. After a predetermined period has elapsed, a low-level pulse is supplied as PTN so that the noise signal in the pixel in the first row is held in the column circuit.

At T6a, a high-level pulse is supplied to the second transfer transistor in the first pixel row. As a result, only the charge in the charge storage part and the charge that can move over the potential barrier between the photoelectric conversion part and the charge storage part are transferred to the amplifier (first step).

At T6b, a low-level pulse is supplied to the second transfer transistor in the first pixel row to turn off the second transfer transistor.

At T7, a high-level pulse is supplied as PTS to hold in the column circuit the signal based on the signal charges read in the first step.

At T8, a low-level pulse is supplied as PSEL and a high-level pulse is supplied as PRES to the first pixel row. As a result, the charge transferred to the amplifier in the first step is reset.

At T9, to again read the same row, a low-level pulse is supplied as PRES and a high-level pulse is supplied as PSEL to the first pixel row.

At T10, a high-level pulse is supplied as PTN. After a predetermine period has elapsed, a low-level pulse is supplied as PTN thereby holding the noise signal in the pixel in the first row in the column circuit.

At T11a, a high-level pulse is supplied to the first transfer transistor and the second transfer transistor in the first pixel row thereby turning on these transistors (second step). As a result, the signal charges accumulated in the photoelectric conversion part are transferred to the FD region via the charge storage part.

At T11b, a low-level pulse is supplied to the second transfer transistor in the first pixel row thereby turning off the second transfer transistor.

At T12, a high-level pulse is supplied as PTS. After a predetermined period has elapsed, a low-level pulse is supplied as PTS to hold in the column circuit the signal based on the signal charges transferred in the second step.

At T13, a low-level pulse is supplied as PSEL and a high-level pulse is supplied as PRES to the first pixel row.

Thereafter, the signals obtained in the first and second steps described above are added together by the signal processing unit 105. This makes it possible to use almost all charges generated via the photoelectric conversion by the photoelectric conversion part to form an image signal regardless of the dynamic range of the reading circuit disposed at the stage following the photoelectric conversion part and the charge storage part.

By repeating the process from T4 to T13 for respective pixel rows, it is possible to read one frame of signal.

In the present embodiment, the first step and the second step are performed for each row. Alternatively, the first step may be first performed for all rows, and after the first step is completed for all rows, the second step may be performed. That is, after the transferring of charge from the charge storage part to the FD region is completed over the entire image area, the process may return to the first row and reading from the photoelectric conversion part to the FD region may be performed starting with the first row.

FIGS. 4A to 4H illustrate potential profiles at various times described above with reference to FIG. 3. Solid bands shown at the top of these figures indicate that the photoelectric conversion part or other parts are protected by the mechanical shutter from light exposure.

Figure 4A:
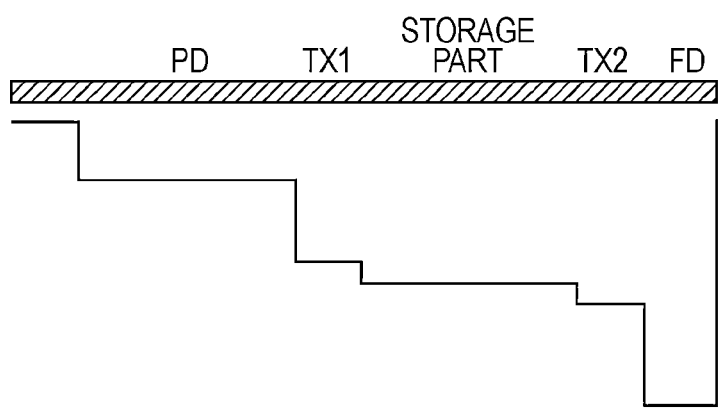
FIGS. 4A to 4H are diagrams illustrating potential profiles according to an embodiment of the present invention.

FIG. 4A illustrates a potential profile in a state in which the charges in the photoelectric conversion part and the charge storage part are reset before the signal charges are accumulated in the photoelectric conversion part and the charge storage part. Note that the charge transferred to the FD region is taken away by the reset transistor although not shown in FIG. 4A. In this state, the mechanical shutter is in the closed state and thus no light is incident on the photoelectric conversion part.

Figure 4B:
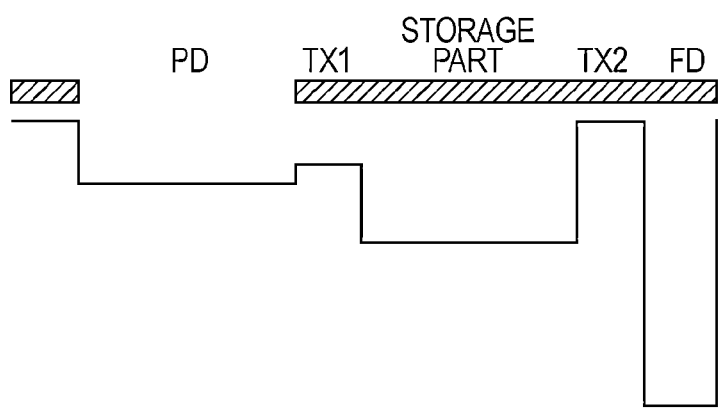
Figure 4C:
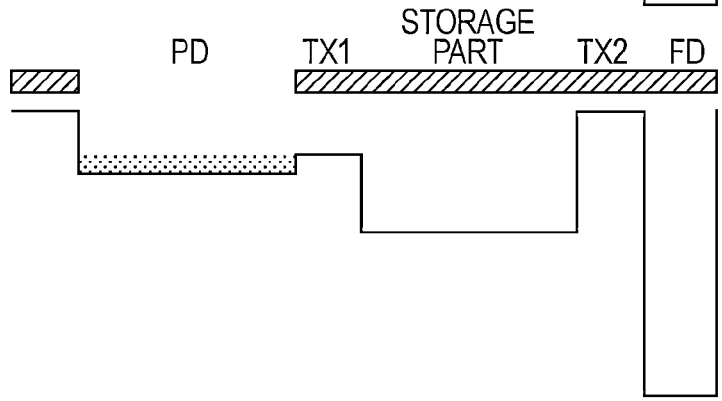
Figure 4D:
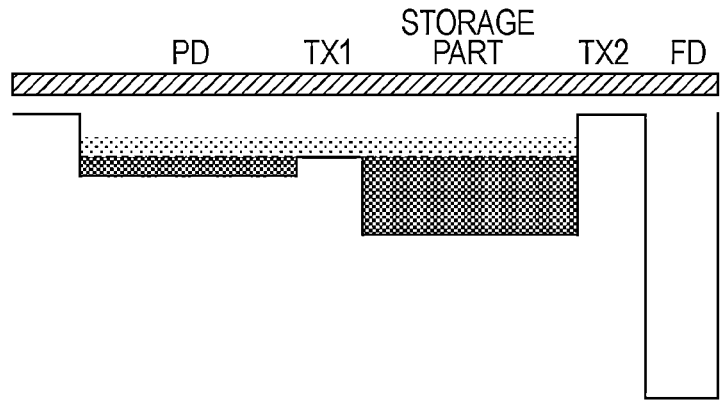

FIGS. 4B to 4D illustrates potential profiles in a signal charge generation period in which the mechanical shutter is opened so that light is incident on the photoelectric conversion part and signal charges are generated by photoelectric conversion.

More specifically, FIG. 4B illustrates a potential profile in a state immediately after the mechanical shutter is opened. In this state, there is no generated signal charge yet in the photoelectric conversion part.

FIG. 4C illustrates a state in which a small amount of light is incident, and signal charges are held in the photoelectric conversion part without flowing over a potential barrier which is formed between the photoelectric conversion part and the charge storage part wherein the height of the potential barrier is determined by the peak value of a pulse supplied to the first transfer transistor. Note that in this state, a low-level pulse is supplied to the first transfer transistor such that the potential barrier has a relatively low height that allows a charge generated in the photoelectric conversion part to be immediately move to the charge storage part. Such a state can be achieved by implementing the first transfer transistor, for example, by a buried-channel MOS transistor.

FIG. 4D illustrates a state in which the signal charges generated in the photoelectric conversion part flow to the charge storage part beyond the potential barrier formed by the first transfer transistor and thus the signal charges are also accumulated in the charge storage part. Herein, for simplicity, let us assume that the number of charges existing in the photoelectric conversion part in a region below a dashed line shown in FIG. 4D is Q1=10000, the number of charges existing in a region below the dashed line in the charge storage part is Q2=60000, and the number of charges existing above the dashed line is Q3=40000. The dashed line indicates the height of the potential barrier in the state in which the low-level pulse is supplied to the first transfer transistor.

Figure 4E:
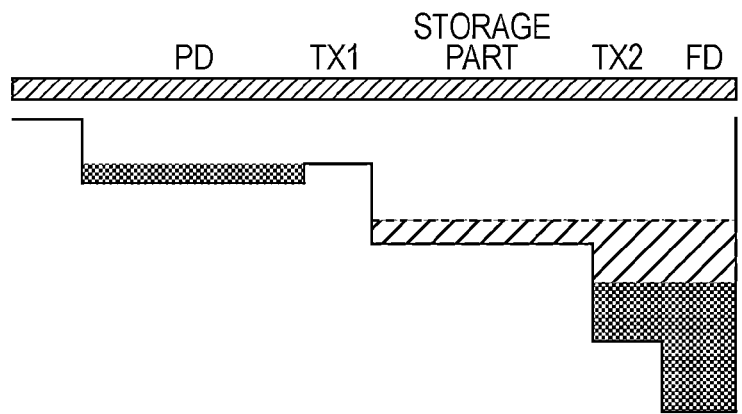

FIG. 4E illustrates a potential profile in a period from time T6a to time T6b shown in FIG. 3. In this state, the low-level pulse is supplied to the first transfer transistor while the high-level pulse is supplied to the second transfer transistor (first step). In this process in the first step, the charges Q3 and Q2 in FIG. 4D are transferred.

Figure 4F:
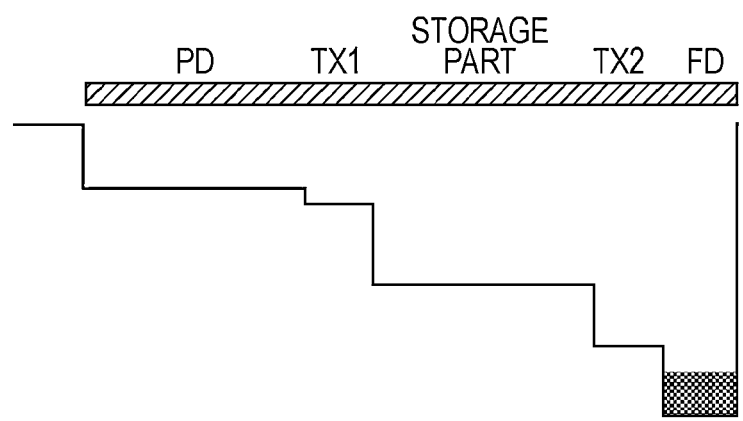

FIG. 4F illustrates a potential profile in a period from time T11a to time T11b shown in FIG. 3. In this state, the high-level pulse is supplied to the first transfer transistor and to the second transfer transistor (second step). In this process in the second step, the signal charges held in the photoelectric conversion part are transferred to the FD region.

Figure 4G:
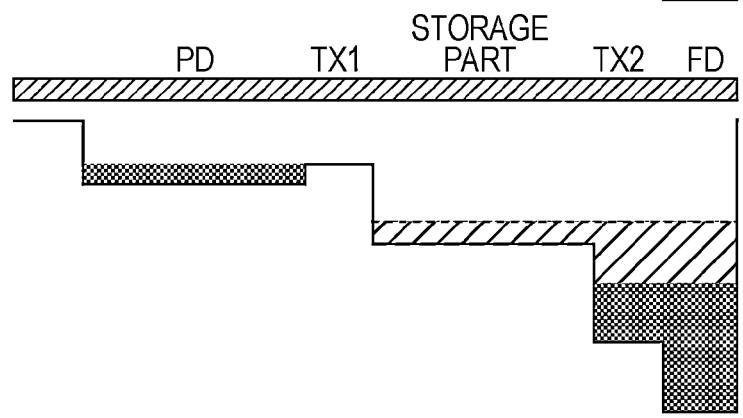
Figure 4H:
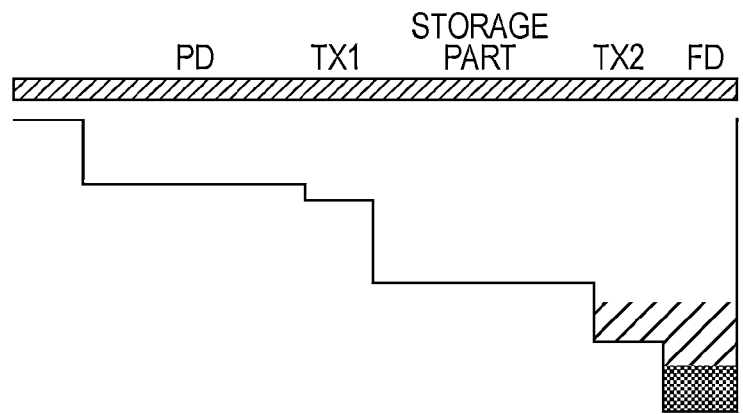

If the number of charges Q2 and Q3 becomes greater than that the FD region can hold, there can occur a possibility that all charges are not transferred to the FD region in the period from T6a to T6b as shown in FIG. 4G. As shown by a dash-dot line in FIG. 4G, when all charges cannot be transferred to the FD region, the charge is partially left in the charge storage part. Even in such a case, as shown in FIG. 4H, all the remaining charges can be transferred together with the charges in the photoelectric conversion part to the FD region in the next transferring operation. This can be achieved when the following condition is satisfied:

$$Q2+Q3-QFDMAX+Q1<QFDMAX \quad \text{(Condition 1)}$$

where QFDMAX denotes the maximum number of charges that can be completely transferred to the FD region at a time.

If Q1 is greater than QFDMAX, some charges remain without being read out when the pixel driving is ended. To avoid this, the following condition is to be satisfied:

$$QFDMAX>Q1 \quad \text{(Condition 2)}$$

There is a possibility that when the charge of QFDMAX is read into the FD region, the signal based on the charge cannot be correctly read by the source follower or the following reading circuit. This can occur if the dynamic range of the reading circuit is smaller than the dynamic range of the FD region. In this case, the optical signal is partially lost.

Examples of reading circuits having the above-described limit include an amplifier of each pixel, a column amplifier disposed in the column circuit, a column analog-to-digital converter, and a final analog amplifier and analog-to-digital converter disposed in each output channel.

As an example, the dynamic range of the pixel amplifier is explained. Herein, it is assumed that the amplifier includes an amplifying transistor and a constant current source configured in the form of a source follower.

When a large number of charges are transferred from the photoelectric conversion part and the charge storage part to the FD region a reduction in potential occurs in the FD region. As a result of the reduction in potential in the FD region, if the difference between the voltage of the FD region, i.e., the voltage of the gate of the amplifying transistor and the voltage of the source of the amplifying transistor becomes smaller than a threshold voltage (Vth) of the amplifying transistor, the amplifier does not function as the source follower, and thus it is impossible to read the signal. Even when the number of charges read by the amplifier is smaller than the dynamic range of the source follower circuit, if the column amplifier has a high gain, the input dynamic range of the column amplifier is limited, and this determines the saturation of the reading circuit.

In view of the above, the value of QFDMAX may be set to a value that allows the number of charges that does not exceed the dynamic range of the reading circuit to be transferred.

For the purpose of comparison with the present embodiment, for example, let us consider a configuration in which charges are transferred simultaneously from the photoelectric conversion part and the charge storage part to the FD region, and a configuration in which charges are first transferred from the photoelectric conversion part to the charge storage part and then charges in the photoelectric conversion part and charges in the charge storage part are transferred together to the FD region. In these two configurations, the saturation number of charges is increased by the provision of the charge storage part, which results in an increase in probability that the number of charges exceeds the dynamic range of the FD region or the following reading circuit. That is, although the saturation number of charges is increased by the provision of the charge storage part, the increased charges are not necessarily used effectively. In contrast, in the present embodiment, after the charges in the charge storage part are transferred to the FD region, the charges in the photoelectric conversion part are transferred to the FD region via the charge storage part, and thus it is possible to fully use the charges increased by the charge storage part.

In the present embodiment, the dynamic range is expanded by the provision of the charge storage part, and the reading is possible without being limited by the dynamic range of the reading circuit disposed at the stage following the photoelectric conversion part and the charge storage part.

The present embodiment is very useful in particular when the overall dynamic range of the photoelectric conversion part and the charge storage part is greater than the dynamic range of the reading circuit disposed at the stage following the photoelectric conversion part.

Figure 5:
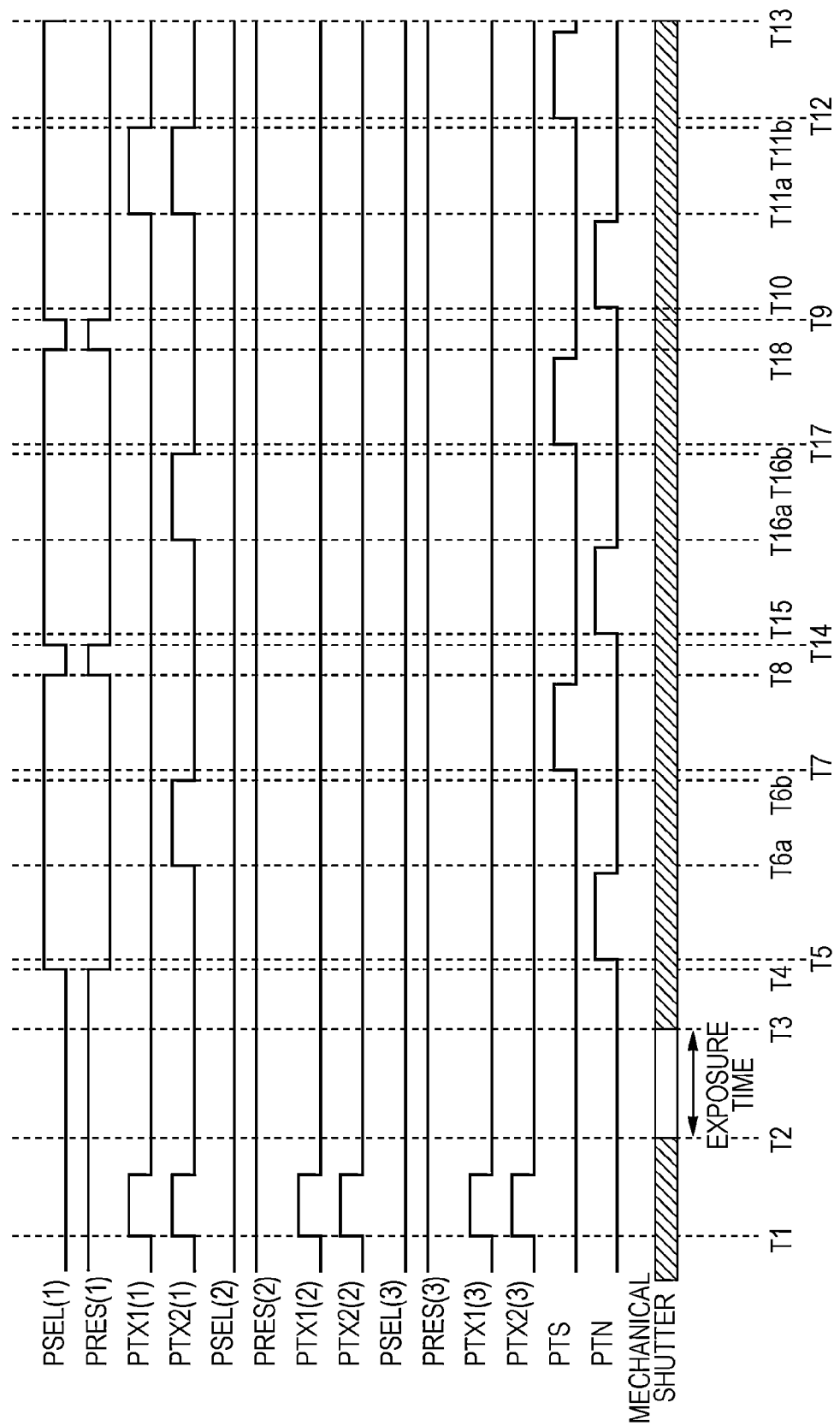
FIG. 5 is a diagram illustrating driving pulses according to an embodiment of the invention.

FIG. 5 illustrates driving pulses according to a second embodiment of the invention. In this second embodiment, as can be seen from T14 to T18, transferring from the charge storage part to the FD region by the second transfer transistor is performed a greater number of times than in the previous embodiment. In the additional transferring, a turning-on pulse is supplied a plurality of times only to the second transfer transistor. In the specific example shown in FIG. 5, an additional turning-on pulse is supplied in a period from T16a to T16b.

When the condition (1) described in the first embodiment is not satisfied, a certain number of charges remain in the charge storage part after the end of the process of transferring the charges from the photoelectric conversion part to the FD region, and thus the signal charges are not fully used. This can occur when QFDMAX is small or when the sum of Q1, Q2, and Q3 is greater than 2×QFDMAX.

In such a case, after the signal charges stored in the charge storage part are transferred, reading from the charge storage part is further performed before the signal charges held in the photoelectric conversion part are transferred. That is, the second embodiment includes an additional step to perform re-reading to transfer only the signal charges remaining in the charge storage part. This reduces the number of charges remaining in the charge storage part at the end of the transferring process.

The present embodiment is useful in particular when the sum of Q2 and Q3 is much greater than QFDMAX.

The additional turning-on pulse to turn on the second transfer transistor may be supplied only once or a plurality of times depending on the value of Q2+Q3.

FIG. 6 illustrates, in the form of a timing chart, driving pulses according to a third embodiment. In this third embodiment, the reading circuit has a variable-gain amplifier that processes the signal output from pixels. As represented by 601 in FIG. 7C, the gain of the amplifier in the second step (in which the charges in the photoelectric conversion part and the charge storage part are read) is switched to be G (G>1) times greater than the gain in the first step. That is, the gain for the signal read in the second step is set to be greater than the gain for the signal read in the first step.

The operation according to the present embodiment is described in further detail below with reference to FIGS. 7A to 7D.

Figure 7A:
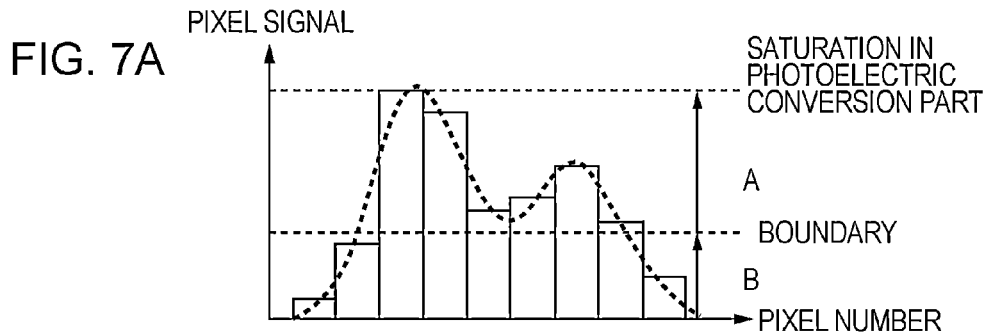
FIGS. 7A to 7D are diagrams illustrating pixel signal distributions according to an embodiment of the present invention.

FIG. 7A illustrates a distribution of charges generated by incident light over pixels in the photoelectric conversion part. A saturation level in the photoelectric conversion part and a boundary of signal charges stored in the charge storage part are represented by dotted lines.

Figure 7B:
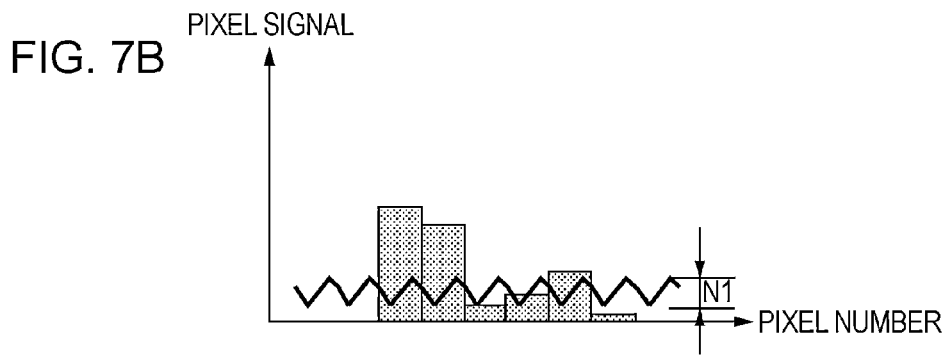

FIG. 7B illustrates a signal corresponding to a component A shown in FIG. 7A, i.e., the signal based on the signal charges transferred in the first step from the charge storage part. Random noise in this step can be represented as $N1=V_{RN1}$ (mVrms).

Figure 7C:
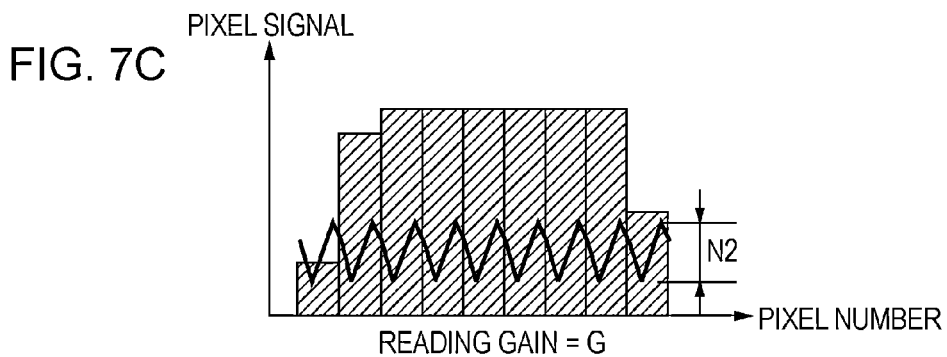

FIG. 7C illustrates a signal corresponding to a component B shown in FIG. 7A, i.e., a signal component extracted for that based on the signal charges transferred in the second step mainly from the photoelectric conversion part. Herein, it is assumed that the reading circuit at the following stage has a gain G. In this case, the random noise can be given by $N2=V_{RN2}$ (mVrms).

Thereafter, the signal components shown in FIGS. 7B and 7C are combined together to obtain a single image. In this combination process, to achieve a constant gradient in output with respect to light intensity, i.e., to achieve a constant signal sensitivity, the signal shown in FIG. 7C read with the high gain G is divided by the gain G.

Figure 7D:
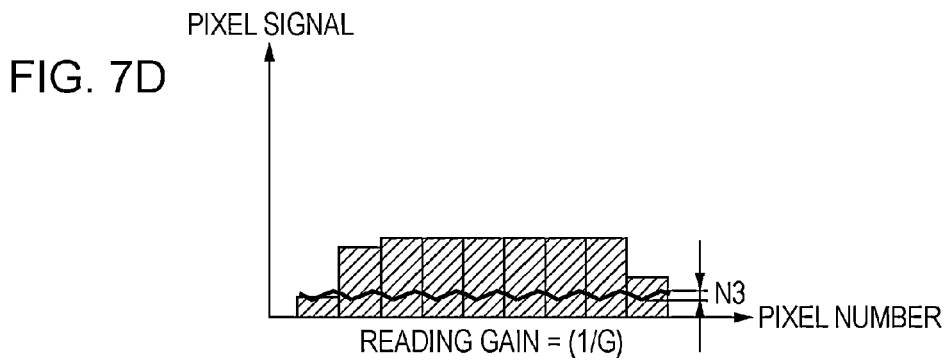

FIG. 7D illustrates the signal obtained as a result of the division of the signal shown in FIG. 7C by the gain G. As the signal level is reduced, the noise level is also reduced to 1/G.

In this case, the random noise is given by $N3=V_{RN2}/G$ (mVrms).

After the combination of the two signals, the random noise is given by $$((V_{RN1})^2+(V_{RN2}/G)^2)^{0.5}$$

which is lower than the noise obtained when the gain switching is not performed, i.e., $$((V_{RN1})^2+(V_{RN2})^2)^{0.5}$$

Thus, by increasing the gain of the amplifier for the signal read in the second step in the above-described manner, it is possible to increase the signal-to-noise ratio (SN ratio). As a result, it becomes possible to take an image with high sensitivity for a subject with low luminance. As for the amplifier for the above purpose, for example, a column amplifier may be used.

Effects inherent to the present embodiment of the invention are described below. In the case of a subject with low luminance, almost all signal charges generated in the photoelectric conversion part are held in the photoelectric conversion part without flowing over the potential barrier between the photoelectric conversion part and the charge storage part. That is, for the subject with low luminance, the ratio of the number of signal charges held in the photoelectric conversion part to the number of signal charges that are not held is high, and thus the ratio of the signal read in the second step to the total signal is high. Therefore, by increasing the gain of the reading circuit for the signal based on the signal charges transferred in the second step, it is possible to increase the signal-to-noise ratio (SN ratio), and thus it is possible to take an image with high sensitivity for a subject with low luminance.

However, the increase in the gain of the reading circuit results in a reduction in the input dynamic range. That is, the increase in gain results in a reduction in QFDMAX. More specifically, if the gain is increased by a factor G, the input dynamic range becomes QFDMAX/G. Therefore, when the gain of the reading circuit is increased, it is important to read a small number of charges with high accuracy and with small dispersion. In contrast, in the reading in the second step, the reading is performed for the signal charges accumulated in the photoelectric conversion part without passing the signal charges over the relatively low potential barrier between the photoelectric conversion part and the charge storage part, and thus it is rather easy to achieve small dispersion in the reading.

In the present embodiment, as described above, the charges are transferred part by part from the charge storage part and the photoelectric conversion part via a plurality of transferring operations. This makes it possible to achieve a small dispersion in the first and second output signals. Thus, it is possible to increase the total number of charges transferred at a time, and it is possible to set the reading circuit to have a large gain.

To achieve high performance, the amount of saturation charge, Q1, in the photoelectric conversion part may be set to satisfy the following condition:

$$Q1 < QFDMAX/G$$

A fourth embodiment is described below. In this fourth embodiment, the operation is switched between a mode in which the signal obtained when only the signal charges stored in the charge storage part are transferred to the FD region is used in forming an image and a mode in which the signal is not used. That is, when the output signal based on the signal charges stored in the charge storage part is smaller than a predetermined threshold value, the signal is not used in forming an image. This prevents an increase in random noise. The signal to be compared with the threshold value may be either the signal obtained when only the signal charges stored in the charge storage part are transferred to the FD region or the signal obtained when the signal charges mainly held in the photoelectric conversion part are transferred to the FD region. Alternatively, information associated with the amount of incident light may be acquired from an AF sensor disposed properly, and the switching as to whether the signal is added or not may be determined based on the information associated with the amount of incident light. In any case, the switching as to whether the signal is added or not is performed depending on the amount of light incident on one pixel of a group of a plurality of pixels.

Figure 8A:
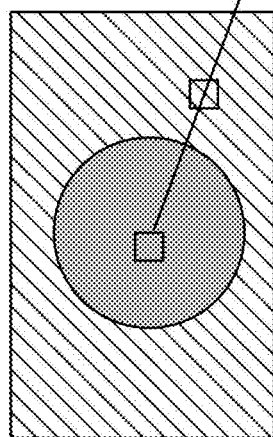
FIGS. 8A to 8C are diagrams illustrating a concept of signal processing according to an embodiment of the present invention.
Figure 8B:
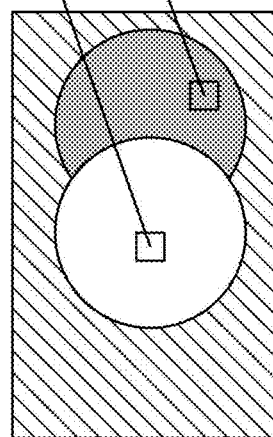
Figure 8C:
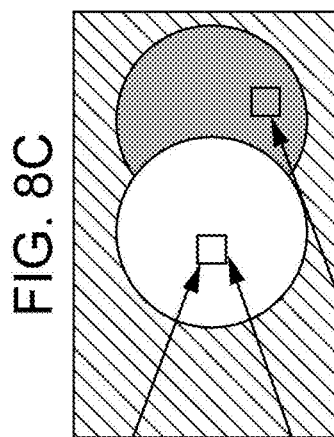

A further detailed explanation is given below with reference to FIGS. 8A to 8C. FIG. 8A illustrates a signal obtained when only the signal charges stored in the charge storage part are transferred to the FD region, and FIG. 8B illustrates a signal obtained when the signal charges mainly stored in the charge storage part are transferred to the FD region. FIG. 8C illustrates a composition of the signals shown in FIG. 8A and FIG. 8B. In FIG. 8A, the signal in an area in a square box represented by a white line is dominated by a random noise component. The addition of this signal results in a reduction in signal-to-noise ratio. In contrast, in the case of the signal in an area in a square box represented by a white line shown in FIG. 8B, the signal has a sufficiently high level that should be used in forming an image, as can be seen from a gray color in FIG. 8B. For example, for a subject with low luminance, no signal charge flows over the potential barrier formed between the photoelectric conversion part and the charge storage part, and all signal charges are accumulated only in the photoelectric conversion part. That is, there is substantially no signal charge in the charge storage part. Therefore, if the transferring from the charge storage part is performed in this situation, the result is only an increase in noise.

To avoid the above situation, when the signal from the charge storage part is lower than the predetermined threshold value, the signal obtained as a result of the transferring of only the signal charges stored in the charge storage part to the FD region is not used in forming an image. On the other hand, when the signal from the photoelectric conversion part is higher than the predetermined threshold value, it is determined that there are signal charges also in the charge storage part, and thus the signal charges in the charge storage part are used in forming an image.

The present embodiment may be applied to other embodiments to achieve, in addition to the benefits obtained in the previous embodiments, the benefit(s) of forming a high-quality image without reducing the signal-to-noise ratio for a relatively low amount of incident light.

Figure 9:
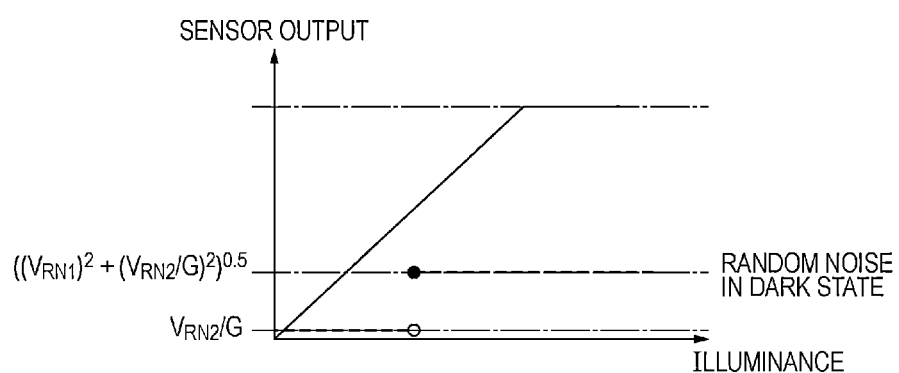
FIG. 9 is a graph illustrating the ratio of noise to a signal according to an embodiment of the present invention.

More specifically, as shown in FIG. 9, the ratio of random noise to the total signal increases with decreasing illuminance. Even in a range in which the ratio of random noise to the total signal is relatively large, the present embodiment makes it possible to achieve a low-noise characteristic without being influenced by random noise $V_{RN1}$.

FIG. 10 illustrates driving pulses according to a fifth embodiment of the invention. This fifth embodiment is different from the previous embodiments in that when charges are transferred from the charge storage part to the FD region, the charges are transferred part by part via a plurality of transferring operations using intermediate-level pulses. The intermediate-level pulse refers to a pulse having a peak value in a range between the peak values of the turning-on pulse and the turning-off pulse. The intermediate-level pulse may be obtained by modifying the control unit 102 such that it is capable of generating the intermediate-level pulse.

First, at T1, a high-level pulse is supplied to the reset transistor and first and second transfer transistors to turn on them thereby resetting the charges in the photoelectric conversion part, the charge storage part, and the FD region. In this process, the mechanical shutter is maintained in the closed state.

At T2, the mechanical shutter is opened so that light is incident on the photoelectric conversion part. In this state, a low-level pulse is supplied to the respective transfer transistors so that the transfer transistors are turned off.

At T3, the mechanical shutter is closed.

At T4, a low-level pulse is supplied as PRES to pixels in the first row, and a high-level pulse is supplied as PSEL. Although in the present example, the low-level pulse PRES and the high-level pulse PSEL are supplied at the same time, they may be supplied at different times. However, to suppress kTC noise in the reset part, the low-level pulse should be supplied as PRES at least over a period during which the high level is supplied as PTN to sample a noise signal.

At T5, a high-level pulse is supplied as PTN so that the noise signal in the pixel in the first row is held in the column circuit.

At T6a, an intermediate-level pulse is supplied to the second transfer transistor in the first pixel row. As a result, of the signal charges held in the photoelectric conversion part and the charge storage part, only part of the signal charges that can move over the potential barrier formed by the intermediate-level pulse are transferred to the FD region (first step).

At T6*b*, a low-level pulse is supplied to the second transfer transistor in the first pixel row to turn off the second transfer transistor.

At T7, a high-level pulse is supplied as PTS to hold in the column circuit the signal based on the signal charges read in the first step.

At T8, a low-level pulse is supplied as PSEL and a high-level pulse is supplied as PRES to the first pixel row. As a result, the charge transferred to the FD region in the first step is reset.

At T9, a high-level pulse is supplied as PTN so that the noise signal in the pixel in the first row is held in the column circuit.

At T10*a*, a high-level pulse is supplied to the second transfer transistor in the first pixel row thereby turning on the second transfer transistor (second step). The peak value of this pulse may be set such that the charge stored in the charge storage part is completely transferred to the FD region. Note that in this state, the pulse supplied to the first transfer transistor in the first pixel row is maintained at the low level.

At T10*b*, a low-level pulse is supplied to the second transfer transistor in the first pixel row to turn off the second transfer transistor.

At T11, a high-level pulse is supplied as PTS to hold in the column circuit the signal based on the signal charges transferred in the second step.

At T12, a low-level pulse is supplied as PSEL and a high-level pulse is supplied as PRES to the first pixel row.

At T13, a high-level pulse is supplied as PTN so that the noise signal in the pixel in the first row is held in the column circuit.

At T14*a*, a high-level pulse is supplied to the first transfer transistor and the second transfer transistor in the first pixel row thereby turning on these transistors (third step). In this process in the third step, the signal charges held in the photoelectric conversion part are transferred to the FD region.

At T14*b*, a low-level pulse is supplied to the first transfer transistor and the second transfer transistor in the first pixel row thereby turning off these transistors.

At T15, the signal based on the signal charges transferred in the third step is held in the column circuit.

Thereafter, the signals obtained in the first to third steps described above are added together by the signal processing unit 105. Thus, it is possible to treat, as the charge to form an image, almost all charges generated via the photoelectric conversion by the photoelectric conversion part regardless of the dynamic range of the reading circuit disposed at the stage following the photoelectric conversion part and the charge storage part.

By repeating the process from T4 to T15 for respective pixel rows, it is possible to read one frame of signal.

Although the transferring operation using the intermediate-level pulse in the period from T6*a* to T6*b* (second step) is performed only once in the above example, the transferring operation may be repeated a plurality of times.

FIGS. 11A to 11G illustrate potential profiles at various times described above with reference to FIG. 10. Solid bands shown at the top of these figures indicate that the photoelectric conversion part or other parts are protected by the mechanical shutter from light exposure.

Figure 11A:
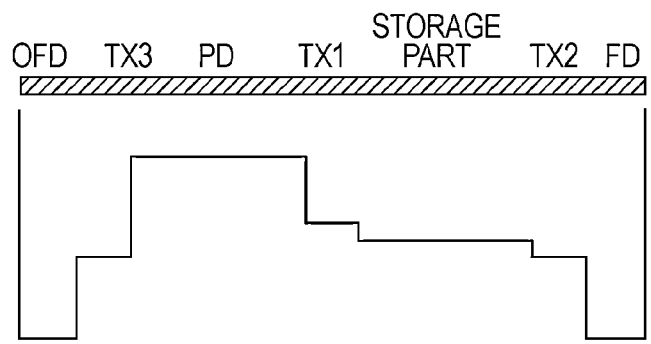
FIGS. 11A to 11G are diagrams illustrating potential profiles according to an embodiment of the present invention.

FIG. 11A illustrates a potential profile in a state in which an operation of resetting the charges in the photoelectric conversion part and the charge storage part is performed before the signal charge generation period. This operation is performed in the period from T1 to T2 shown in FIG. 10. Note that the charge transferred to the FD region is taken away by the reset transistor although not shown in FIG. 11A. In this state, the mechanical shutter is in the closed state and thus no light is incident on the photoelectric conversion part.

Figure 11B:
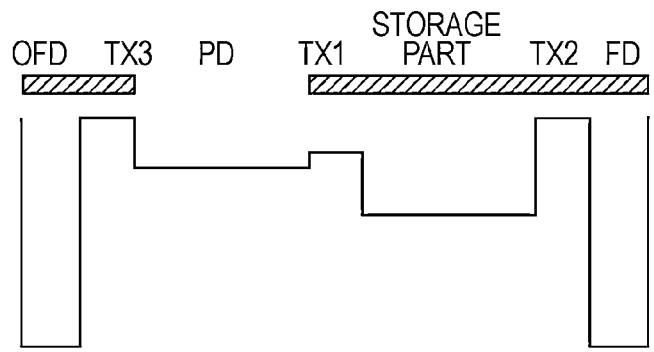
Figure 11C:
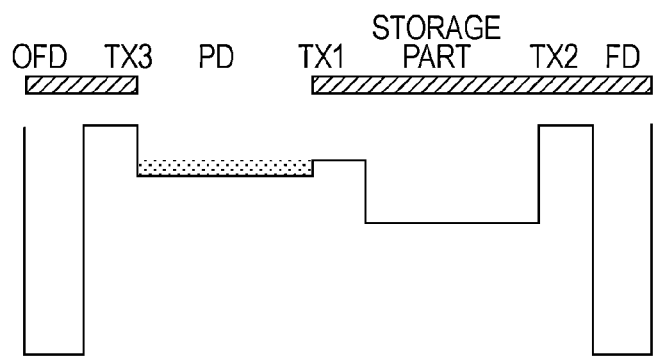
Figure 11D:
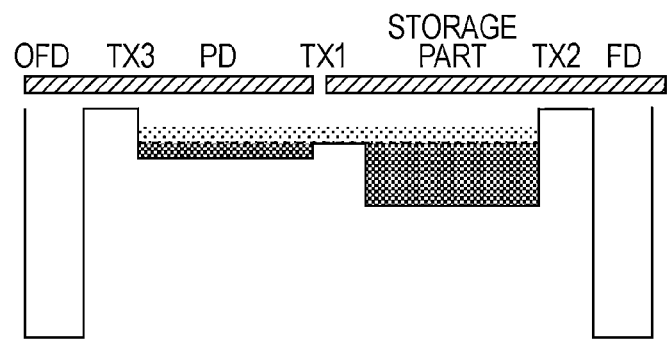

FIGS. 11B to 11D illustrate potential profiles in a signal charge generation period in which the mechanical shutter is opened so that light is incident on the photoelectric conversion part and signal charges are generated by photoelectric conversion.

FIG. 11B illustrates a potential profile in a state immediately after the mechanical shutter is opened. In this state, there is no generated signal charge yet in the photoelectric conversion part.

FIG. 11C illustrates a potential profile in a state in which a small amount of light is incident, and signal charges are held in the photoelectric conversion part without flowing over a potential barrier which is formed between the photoelectric conversion part and the charge storage part wherein the height of the potential barrier is determined by the peak value of a pulse supplied to the first transfer transistor. Note that in this state, a low-level pulse is supplied to the first transfer transistor such that the potential barrier has a relatively low height that allows a charge generated in the photoelectric conversion part to be immediately move to the charge storage part. Such a state can be achieved by implementing the first transfer transistor, for example, by a buried-channel MOS transistor.

FIG. 11D illustrates a potential profile in a state in which the signal charges generated in the photoelectric conversion part flow to the charge storage part beyond the potential barrier formed by the first transfer transistor and thus the signal charges are also accumulated in the charge storage part. Herein, for simplicity, let us assume that the number of charges existing in the photoelectric conversion part in a region below a dashed line shown in FIG. 11D is Q1=10000, the number of charges existing in the charge storage part in a region below the dashed line is Q2=60000, and the number of charges existing above the dashed line is Q3=40000.

Figure 11E:
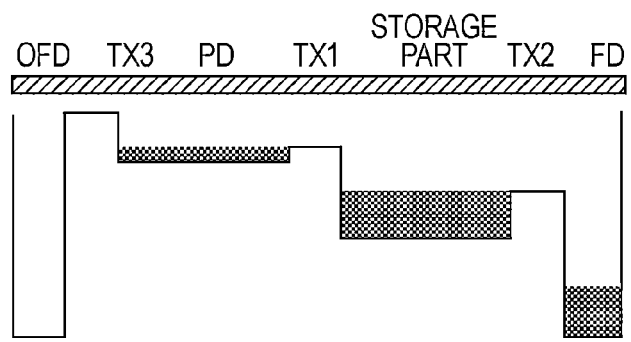
Figure 11F:
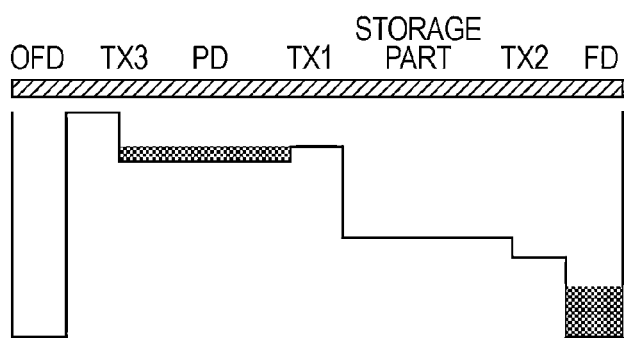

FIG. 11E illustrates a potential profile in a period from time T6*a* to time T6*b* shown in FIG. 10. In this state, the low-level pulse is supplied to the first transfer transistor while the intermediate-level pulse is supplied to the second transfer transistor (second step). In the process in this second step, all of charges Q3 and part of Q2 shown in FIG. 11D are transferred to the FD region. The amount of charge transferred to the FD region can be arbitrarily controlled by adjusting the peak value of the intermediate-level pulse supplied to the second transfer transistor. FIG. 11F illustrates a potential profile in a period from time T10*a* to time T10*b* shown in FIG. 10. In this state, the low-level pulse is supplied to the first transfer transistor while the high-level pulse is supplied to the second transfer transistor (third step). In this process in the third step, charges remaining in the charge storage part without being transferred in the second step are transferred to the FD region. For example, 50000 signal charges are transferred.

Figure 11G:
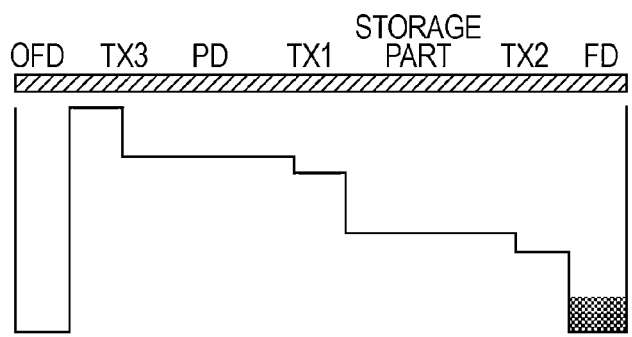

FIG. 11G illustrates a potential profile in a period from time T14*a* to time T14*b* shown in FIG. 10. In this state, the high-level pulse is supplied to the first transfer transistor and to the second transfer transistor (fourth step). In the process in this fourth period, the signal charges held in the photoelectric conversion part are transferred to the FD region. For example, 2000 charges are transferred in this step.

Effects inherent to the present embodiment of the invention are described below. In the first embodiment described above, it is assumed that all of signal charges of QFDMAX can be correctly processed by the source follower and the reading circuit located at the stage following the FD region. That is, it is assumed that when the signal charges of QFDMAX are transferred to the FD region, a value corresponding to the signal is correctly output to the outside without having saturation in the circuit.

However, in practice, there is a possibility that the amount of charge that can be correctly treated by the circuit is lower than QFDMAX (hereinafter, the maximum amount of charge that can be correctly treated by the circuit will be referred to as QFDMAX2) depending on the power supply voltage for the amplifier or other factors. In such a case, limiting the amount of charge transferred to the FD region is performed.

In this case, the amount of charges transferred to the FD region is limited to QFDMAX2 or less by controlling the transferring using the intermediate-level pulse so that all charges are correctly read. More specifically, the peak value of the intermediate-level pulse is adjusted so that the number of signal charges transferred in response to the intermediate-level pulse is less than the maximum number of charges allowed to be correctly read by the reading circuit.

To adapt to this situation, the saturation amount of charge Q1 of the photodiode may be set such that the following condition is satisfied:

$$Q1 < QFDMAX2$$

By setting Q1 to be sufficiently lower than QFDMAX2, it is possible to perform high-gain amplification only for the signal from the photoelectric conversion part thereby reducing the noise in a dark part of an image.

The present embodiment is very useful in particular when the dynamic range of the FD region is greater than the dynamic range of the reading circuit located at the stage following the photoelectric conversion part.

In the present embodiment, as described above, the dynamic range is expanded by the provision of the charge storage part, and the reading is possible without being limited by the dynamic range of the reading circuit disposed at the stage following the photoelectric conversion part and the charge storage part.

A sixth embodiment of the invention is described below. This sixth embodiment is different from the fifth embodiment in that the intermediate-level pulse is supplied to each pixel row not only once but a plurality of times.

Driving pulses are supplied in a similar manner to those illustrated in FIG. 10 except that a second intermediate-level pulse is additionally supplied between the intermediate-level pulse and the high-level pulse functioning as the turning-on pulse. Correspondingly, a pulse to reset the FD region and sampling pulses to sample a noise signal and an optical signal in the column circuit are also additionally supplied. The peak value of the intermediate-level pulse may be set to an arbitrary value in the range between the peak value of the high-level pulse for turning on the transfer transistor and the peak value of the low-level pulse for turning off the transfer transistor. The peak value may be equal or different for the plurality of intermediate-level pulses.

The present embodiment may be applied to other embodiments to make it possible to further precisely set the condition associated with the transferring of the charges from the photoelectric conversion part to the FD region so as to adapt to the dynamic range of the reading circuit located at the stage following the photoelectric conversion part.

Figure 12:
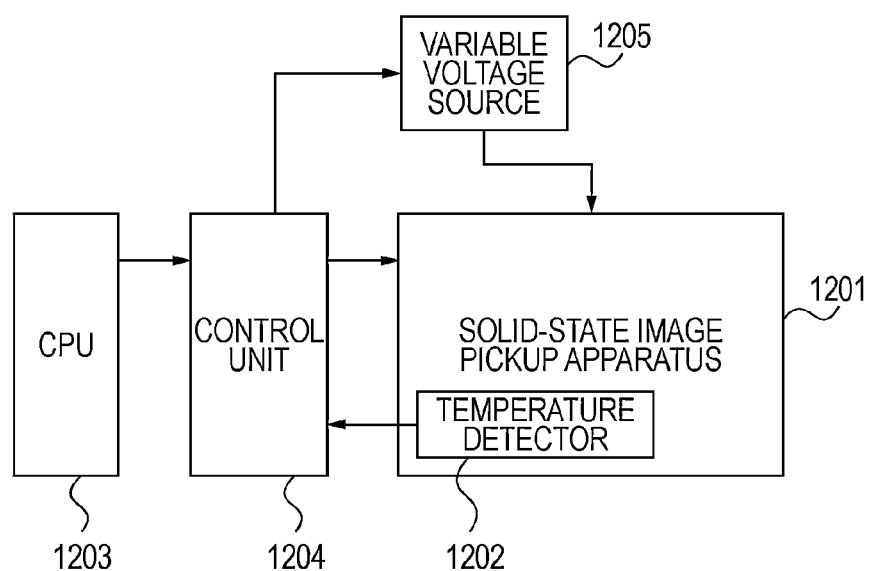
FIG. 12 is a schematic diagram of an image pickup apparatus according to an embodiment of the present invention.

In a seventh embodiment of the invention, the intermediate-level pulse used in the fifth or sixth embodiment is modified depending on temperature. FIG. 12 is a block diagram of an image pickup system including a solid state image pickup apparatus according to the present embodiment.

Reference numeral 1201 denotes a solid state image pickup apparatus. Reference numeral 1202 denotes a temperature detector. Although the temperature detector is disposed inside the solid state image pickup apparatus in this example, the temperature detector may be disposed outside at a location close to the solid state image pickup apparatus. Reference numeral 1203 denotes a CPU. Reference numeral 1204 denotes a control unit that controls the solid state image pickup apparatus depending on temperature information supplied from the temperature detector 1202 and in accordance with a control signal supplied from the CPU 1203. Reference numeral 1205 denotes a variable voltage source configured to supply a voltage depending on the temperature to the solid state image pickup apparatus in accordance with a control signal supplied from the control unit 1204. More specifically, this voltage is supplied to the vertical scanning circuit shown in FIG. 1 to modify the peak value of the intermediate-level pulse or timing of supplying the intermediate-level pulse depending on the temperature.

Next, an operation flow according to the present embodiment is described. First, in a signal charge generation period, a signal charge is accumulated in the photoelectric conversion part. If a predetermined period has elapsed, the signal charge generation period is ended. If the signal charge generation period is ended, the temperate information associated with the solid state image pickup apparatus or the neighborhood thereof is acquired by the temperature detector. A lookup table is then accessed to retrieve a voltage value corresponding to the acquired temperature information, and a voltage with the retrieved value corresponding to the temperature is supplied from the variable voltage source. Thereafter, the reading operation described above is performed.

The energy of the signal charges varies depending on the temperature. Therefore, when the temperature changes, if the potential barrier formed by the intermediate-level pulse is maintained unchanged, a change occurs in the number of charges transferred to the FD region. In the present embodiment, in view of the above, the temperature detector is provided whereby the peak value of the intermediate-level pulse or the timing of supplying the intermediate-level pulse is changed or switched depending on the signal supplied from the temperature detector.

By applying the present embodiment to the fifth or sixth embodiment described above, it is possible to achieve, in addition to the benefits obtained in the fifth or sixth embodiment, a further benefit that when a change in temperature of the solid state image pickup apparatus or temperature in the ambient occurs, the change in the number of transferred charges can be minimized by adjusting the intermediate-level pulse.

Next, an eighth embodiment is described below. In this eighth embodiment, the intermediate-level pulse used in the previous embodiments is changed depending on the gain of the reading circuit disposed at the stage following the photoelectric conversion part. The reading circuit disposed at the stage following the photoelectric conversion part may include an amplifier disposed in each pixel, a column amplifier disposed in the column circuit, and an output amplifier configured to convert a parallel signal received from the column circuit into a serial signal and output the resultant signal.

Figure 13:
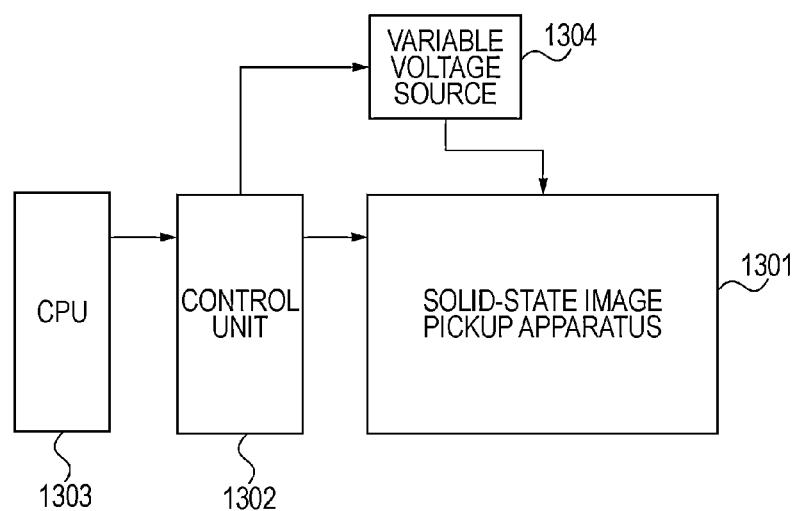
FIG. 13 is a schematic diagram of an image pickup apparatus according to an embodiment of the present invention.

FIG. 13 is a block diagram of an image pickup system including a solid state image pickup apparatus according to the present embodiment of the invention.

Reference numeral 1301 denotes a solid state image pickup apparatus. Reference numeral 1302 denotes a control unit. Reference numeral 1303 denotes a CPU. Reference numeral 1304 denotes a variable voltage source. The switching of the gain of the reading circuit disposed at the stage following the photoelectric conversion part is performed by the control unit 1302 and the CPU 1303 so that the gain is properly controlled depending on a change in sensitivity, reading speed, and/or other factors.

Next, an operation flow according to the present embodiment is described. First, in a signal charge generation period, signal chares are accumulated in the photoelectric conversion part. If a predetermined period has elapsed, the accumulation is ended. A lookup table representing a gain-voltage correspondence is accessed to retrieve a voltage corresponding to the gain of the reading circuit disposed at the stage following the photoelectric conversion part. According to the result of the retrieval, the voltage corresponding to the gain is supplied from the variable voltage source. Thereafter, the reading operation described above is performed. In addition, a temperature detector may be provided whereby the temperature compensation may also be performed in a similar manner to the fourth embodiment.

Next, referring to FIGS. 14A to 14H, an explanation is given below as to effects obtained by changing the peak value of the intermediate-level pulse or by changing the timing of supplying the intermediate-level pulse when the gain of the reading circuit is variable.

FIG. 14A illustrates the dependence of the output voltage on the amount of incident light (photoelectric conversion characteristic) when a first intermediate-level pulse is supplied. FIG. 14B illustrates a photoelectric conversion characteristic obtained when a second intermediate-level pulse is supplied. FIG. 14C illustrates a photoelectric conversion characteristic obtained when a high-level pulse is supplied. FIG. 14D illustrates an output signal characteristic obtained after the charge is transferred to the FD region by a read pulse and addition is performed. FIGS. 14E to 14H illustrate photoelectric conversion characteristics and output signal characteristics obtained when the pulse peak value is changed depending on the gain of the reading circuit. More specifically, photoelectric conversion characteristics and output signal characteristics are illustrated for cases where pulse peak values greater than those used in FIGS. 14A to 14C are applied when the gain of the reading circuit is changed from a first gain to a second gain greater than the first gain.

When the gain of the reading circuit is variable, the amount of incident light (saturation amount of light) that leads to saturation of the reading circuit varies depending on the gain of the reading circuit. Lines 904a, 904b, and 904c in FIGS. 14A to 14C represent characteristics for a low gain of the reading circuit, while lines 906a, 906b, and 906c represent characteristics for a high gain of the reading circuit. When the gain of the reading circuit is low, the saturation occurs at great amount of incident light (saturation amounts of incident light) 905a, 905b, and 905c, and thus all charges transferred to the FD region can be used as an image signal. However, when the gain of the reading circuit is high, saturation occurs at lower values (saturation amounts of incident light) 907a, 907b, and 907c. In this case, part of the charges transferred to the FD region exceed the input dynamic range of the reading circuit, and the image information is partially lost. As a result, the overall photoelectric conversion characteristic obtained by combining the signals in regions A, B, and C in FIGS. 14A to 14C has steps as denoted by 909 in FIG. 14D. That is, the resultant overall photoelectric conversion characteristic has dead zones in which the sensor has no sensitivity. In FIG. 14D, for comparison, a line 908 is also shown that is obtained in an ideal state in which no information is lost.

To avoid the above situation, as shown in FIGS. 14E to 14G, the peak values of the intermediate-level pulses are limited to lower levels than those shown in FIG. 14A to 14C. Alternatively, the pulses may be supplied for shorter periods so that transitional movement of charges is limited, i.e., the number of charges transferred in response to the application of intermediate-level pulses is reduced. This makes it possible to obtain photoelectric conversion characteristics shown in FIGS. 14E to 14G when the pulse is supplied three times to read charges as with FIGS. 14A to 14C. If these signals are combined, the overall photoelectric characteristic shown in FIG. 14H is obtained. Unlike the case shown in FIG. 14D, no information is lost and undesirable dead zones do not appear after zones A, B, and C are combined.

Note that because the number of electrons that can be read at a time is limited, a reduction occurs in the saturation amount of light of the overall characteristic. The reduction in the saturation mount of light can be suppressed by increasing the number of times the intermediate-level pulse is applied, and by increasing the intermediate level voltage.

The present embodiment may be applied to other embodiments to achieve, in addition to the benefits obtained in the other embodiments, an additional benefit that it is possible to obtain a continuous photoelectric conversion characteristic having no dead zone after signals are combined even when a change occurs in the gain of the reading circuit disposed at the stage following the photoelectric conversion part.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-262997 filed Oct. 9, 2008, which is hereby incorporated by reference herein in its entirety.

What is claimed is:

1. An apparatus comprising:
a plurality of pixels, each pixel including a photoelectric conversion part, a charge storage part configured to store a signal charge transferred by a first transfer part from the photoelectric conversion part, an amplifier configured to amplify a signal based on the signal charge transferred by a second transfer part, and a reset part; and
a control unit configured to supply driving pulses, wherein when a signal charge generated during one period is transferred to the amplifier, the control unit supplies pulses such that a turning-on pulse is supplied to the second transfer part while supplying a turning-off pulse to the first transfer part and a turning-off pulse to the reset part thereby transferring the stored signal charge at the charge storage part to the amplifier, a turning-on pulse is then supplied to the reset part to reset the signal charge transferred to the amplifier, and subsequently a turning-on pulse is supplied to the first transfer part and the second transfer part while supplying a turning-off pulse to the reset part to transfer the signal charge held in the photoelectric conversion part to the amplifier via the charge storage part.

2. The apparatus according to claim 1, wherein a charge transferring path between the photoelectric conversion part and the charge storage part is provided in the form of a buried-channel structure.

3. The apparatus according to claim 1, wherein during a period in which the signal charge is accumulated in the photoelectric conversion part and the charge storage part, a potential barrier for the signal charge in a charge transferring path between the photoelectric conversion part and the charge storage part is lower than a potential barrier between the photoelectric conversion part and other regions.

4. The apparatus according to claim 1, wherein the control unit is configured to supply a turning-on pulse a plurality of times to the second transfer part before the turning-on pulse is supplied to the first transfer part and the second transfer part.

5. The apparatus according to claim 1, wherein the control unit is configured to supply an intermediate-level pulse to the second transfer part, the intermediate-level pulse having a peak value in a range between peak values of the turning-on pulse and the turning-off pulse.

6. The apparatus according to claim 5, wherein the control unit is configured to select the peak value of the intermediate-level pulse from a plurality of values.

7. The apparatus according to claim 6, further comprising a reading circuit configured to process a signal output from the amplifier,
wherein the control unit sets the peak value of the intermediate-level pulse such that the number of signal charges transferred by the intermediate-level pulse is smaller than the maximum number of charges that can be read by the reading circuit.

8. The apparatus according to claim 6, further comprising a temperature detector,
wherein the control unit changes the peak value of the intermediate-level pulse depending on temperature information received from the temperature detector.

9. The apparatus according to claim 1, further comprising a variable-gain amplifier circuit configured to process a signal output from the amplifier,
wherein the gain for a signal obtained when the signal charge held in the photoelectric conversion part is transferred to the amplifier by supplying the turning-on pulse to the first transfer part and the second transfer part is smaller than the gain for a signal obtained when the signal charge stored in the charge storage part is transferred to the amplifier by supplying the turning-on pulse to the second transfer part.

10. The apparatus according to claim 1, wherein depending on an amount of light incident on the pixel, switching is performed between a mode in which the signal obtained when the stored signal charge is transferred to the amplifier by supplying the turning-on pulse to the second transfer part is used in forming an image and a mode in which the signal is not used in forming the image.

11. An apparatus comprising:
a plurality of pixels, each pixel including a photoelectric conversion part, a charge storage part configured to store a signal charge transferred by a first transfer part from the photoelectric conversion part, an amplifier configured to amplify a signal based on the signal charge transferred by a second transfer part, and a reset part; and
a control unit configured to supply driving pulses to the first transfer part, the second transfer part and the reset part,
wherein when a signal charge generated during one period is transferred to the amplifier, the control unit supplies driving pulses to the first transfer part, the second transfer part and the reset part is turned off during the period when the charges stored in the charge storage part are transferred to the amplifier while the charges are held in the photoelectric conversion part, and after that during a period when the charges held in the photoelectric conversion part are transferred to the amplifier via the charge storage part, and
wherein the one period is determined in a period in forming one frame of image such that the period is common to all photoelectric conversion parts of the pixels.

12. The apparatus according to claim 11, wherein a charge transferring path between the photoelectric conversion part and the charge storage part is provided in the form of a buried-channel structure.

13. The apparatus according to claim 11, wherein during a period in which the signal charge is accumulated in the photoelectric conversion part and the charge storage part, a potential barrier for the signal charge in a charge transferring path between the photoelectric conversion part and the charge storage part is lower than a potential barrier between the photoelectric conversion part and other regions.

14. The apparatus according to claim 11, wherein the control unit is configured to supply a turning-on pulse a plurality of times to the second transfer part before the turning-on pulse is supplied to the first transfer part and the second transfer part.

15. The apparatus according to claim 11, wherein the control unit is configured to supply an intermediate-level pulse to the second transfer part, the intermediate-level pulse having a peak value in a range between peak values of the turning-on pulse and the turning-off pulse.

16. The apparatus according to claim 11, wherein depending on an amount of light incident on the pixel, switching is performed between a mode in which the signal obtained when the stored signal charge is transferred to the amplifier by supplying the turning-on pulse to the second transfer part is used in forming an image and a mode in which the signal is not used in forming the image.

17. An apparatus comprising:
a plurality of pixels, each pixel including a photoelectric conversion part, a charge storage part configured to store a signal charge transferred by a first transfer part from the photoelectric conversion part, an amplifier configured to amplify a signal based on the signal charge transferred by a second transfer part, and a reset part; and
a control unit configured to supply driving pulses to the first transfer part, the second transfer part and the reset part,
wherein when a signal charge generated during one period is transferred to the amplifier, the control unit supplies driving pulses to the first transfer part, the second transfer part and the reset part such that the charges stored in the charge storage part are transferred to the amplifier while the charges are held in the photoelectric conversion part, and after that the charges held in the photoelectric conversion part are transferred to the amplifier via the charge storage part,
wherein the control unit is configured to supply an intermediate-level pulse to the second transfer part, the intermediate-level pulse having a peak value in a range between peak values of the turning-on pulse and the turning-off pulse, and
wherein the control unit is configured to select the peak value of the intermediate-level pulse from a plurality of values.

18. The apparatus according to claim 17, further comprising a reading circuit configured to process a signal output from the amplifier,
wherein the control unit sets the peak value of the intermediate-level pulse such that the number of signal charges transferred by the intermediate-level pulse is smaller than the maximum number of charges that can be read by the reading circuit.

19. The apparatus according to claim 17, further comprising a temperature detector,
wherein the control unit changes the peak value of the intermediate-level pulse depending on temperature information received from the temperature detector.

20. An apparatus comprising:
a plurality of pixels, each pixel including a photoelectric conversion part, a charge storage part configured to store a signal charge transferred by a first transfer part from the photoelectric conversion part, an amplifier configured to amplify a signal based on the signal charge transferred by a second transfer part, and a reset part; and
a control unit configured to supply driving pulses to the first transfer part, the second transfer part and the reset part; and
a variable-gain amplifier circuit configured to process a signal output from the amplifier,
wherein when a signal charge generated during one period is transferred to the amplifier, the control unit supplies driving pulses to the first transfer part, the second transfer part and the reset part such that the charges stored in the charge storage part are transferred to the amplifier while the charges are held in the photoelectric conversion part, and after that the charges held in the photoelectric conversion part are transferred to the amplifier via the charge storage part,
wherein the gain for a signal obtained when the signal charge held in the photoelectric conversion part is transferred to the amplifier by supplying the turning-on pulse to the first transfer part and the second transfer part is smaller than the gain for a signal obtained when the signal charge stored in the charge storage part is transferred to the amplifier by supplying the turning-on pulse to the second transfer part.

* * * * *